US012385963B2

(12) United States Patent
Ramsey et al.

(10) Patent No.: US 12,385,963 B2
(45) Date of Patent: Aug. 12, 2025

(54) MONITORING SYSTEM FOR CRITICAL ELECTRICAL DISTRIBUTION SYSTEMS

(71) Applicant: Schneider Electric USA, Inc., Andover, MA (US)

(72) Inventors: James Raymond Ramsey, Gallatin, MA (US); Clay Miller Cecil, Nashville, TN (US); Timothy O'Leary, Antioch, TN (US)

(73) Assignee: Schneider Electric USA, Inc., Boston, MA (US)

( * ) Notice: Subject to any disclaimer, the term of this patent is extended or adjusted under 35 U.S.C. 154(b) by 158 days.

(21) Appl. No.: 18/568,161

(22) PCT Filed: Jun. 7, 2022

(86) PCT No.: PCT/US2022/032568
§ 371 (c)(1),
(2) Date: Dec. 7, 2023

(87) PCT Pub. No.: WO2022/261141
PCT Pub. Date: Dec. 15, 2022

(65) Prior Publication Data
US 2024/0288483 A1  Aug. 29, 2024

Related U.S. Application Data

(60) Provisional application No. 63/324,483, filed on Mar. 28, 2022, provisional application No. 63/208,324, filed on Jun. 8, 2021.

(51) Int. Cl.
*G01R 31/08* (2020.01)
*H02B 1/20* (2006.01)
*H02B 1/48* (2006.01)

(52) U.S. Cl.
CPC .......... *G01R 31/086* (2013.01); *H02B 1/202* (2013.01); *H02B 1/48* (2013.01)

(58) Field of Classification Search
USPC ........................................................ 324/126
See application file for complete search history.

(56) References Cited

U.S. PATENT DOCUMENTS

2010/0237699 A1    9/2010  Gibson et al.
2012/0013471 A1*   1/2012  Jones ................... G01R 31/69
                                                      340/584
2019/0103717 A1    4/2019  Pever et al.

FOREIGN PATENT DOCUMENTS

CN   203323879 U    12/2013
CN   107199914 A    9/2017
WO   2020260257 A1  12/2020

OTHER PUBLICATIONS

Caxias, Joao et al., "Transmission Line Inspection Robots: Design of the Power Supply System," 2010 1st International Conference on Applied Robotics for the Power Industry, Oct. 5, 2010, pp. 1-6.
(Continued)

*Primary Examiner* — Farhana A Hoque
(74) *Attorney, Agent, or Firm* — Troutman Pepper Locke LLP

(57) ABSTRACT

Systems and techniques for monitoring critical electrical distribution systems in a manner that provides an early visible indication of deteriorating electrical connections in the critical electrical distribution system.

18 Claims, 12 Drawing Sheets

(56) References Cited

OTHER PUBLICATIONS

Alippi, Cesare et al., "Energy Management in Wireless Sensor Networks with Energy-Hungry Sensors," IEEE Instrumentation & Measurement Magazine, vol. 12, No. 2, Apr. 1, 2009, pp. 16-23.
Braunovic, Milenko et al., "Shape-Memory Alloy Mechanical Contact Devices," IEEE Transactions on Components, Packaging and Manufacturing Technology—Part A, vol. 19, No. 3, Sep. 1, 1996, pp. 295-303.
Extended European Search Report dated Apr. 1, 2025 for corresponding European Patent Application No. 22820922.7, 15 pages.
International Search Report and Written Opinion for corresponding International Application No. PCT/US2022/032568 dated Oct. 26, 2022, 16 pages.

* cited by examiner

MONITORING SYSTEM FOR CRITICAL ELECTRICAL DISTRIBUTION SYSTEMS

TECHNICAL FIELD

The present disclosure relates to electrical distribution systems and, more particularly, to a continuous monitoring system which provides local and remote alarms when a monitored component of the electrical distribution system exceeds a predetermined value.

BACKGROUND

While modern electrical systems are more reliable than ever before, any electrical connection can be degraded over time. For example, this degradation can be the result of insufficient compression at an electrical connection, corrosion, contamination of contact surfaces, water or moisture in the enclosure, and so on. Moreover, this degradation can lead to increased resistance at the affected electrical connection, and ultimately can lead to a temperature increase in equipment associated with the electrical connection (e.g., due to increased current draw, short circuit events, etc.). Insufficient compression of the electrical connection can also result from electrical joint bolts that have been loosened by material creep, mechanical shock, vibration, dynamic loading due to structure support of electrical distribution system, electrical transients, short circuit events and/or thermal cycling without proper expansion means. As a result, electrical connections are typically monitored and/or tested by technicians to ensure that the electrical connections do not degrade to unacceptable levels. In some instances, this monitoring may require that the electrical distribution system and associated equipment connected to the electrical distribution system must be shutdown to ensure the safety of the technicians. Therefore, monitoring is generally done on a yearly schedule, which could result in an unplanned shutdown of the electrical distribution system if a problem occurs between scheduled monitoring.

SUMMARY OF THE DISCLOSURE

One embodiment described herein provides a monitoring system for continuously monitoring components of an electrical distribution system of the type generally found in workplaces that require more electrical power than homes or small business and where unexpected electrical power outages or damage to the electrical distribution system can significantly disrupt normal operations at the workplace. The monitoring system provides a warning of a potential power outage or damage to the electrical distribution system. The warning may be delivered in one or more of the following: a local visual/audible indicator, a visual/audible indicator at a remote monitoring station in the workplace or at any virtual location via a network, e.g., the Internet or a cellular network.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

Identical reference numerals have been used, where possible, to designate identical elements that are common to the figures. However, elements disclosed in one embodiment may be beneficially utilized on other embodiments without specific recitation.

DETAILED DESCRIPTION

Figure 1:
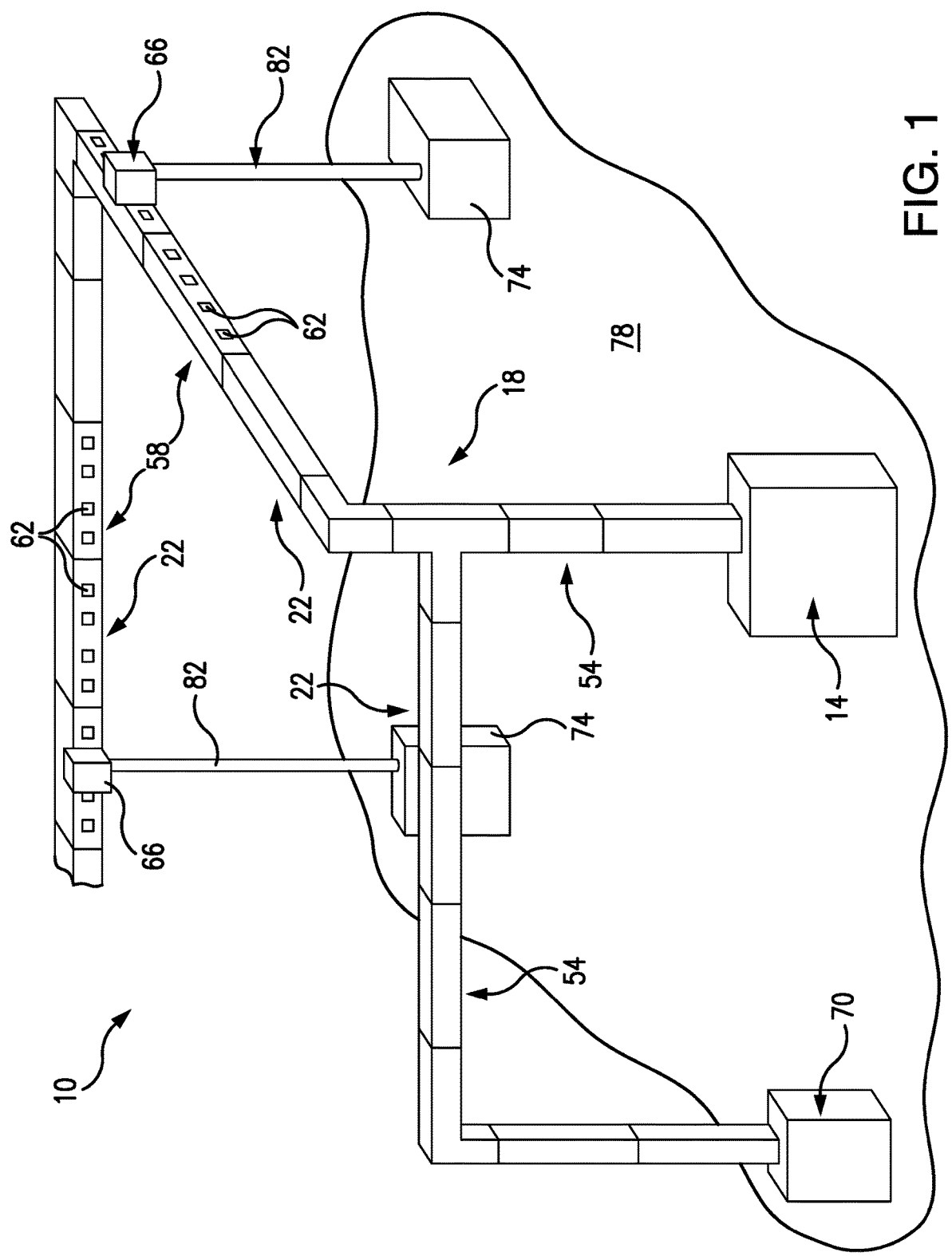
FIG. 1 illustrates a typical electrical distribution system using a busway system, according to one embodiment described herein.
Figure 2:
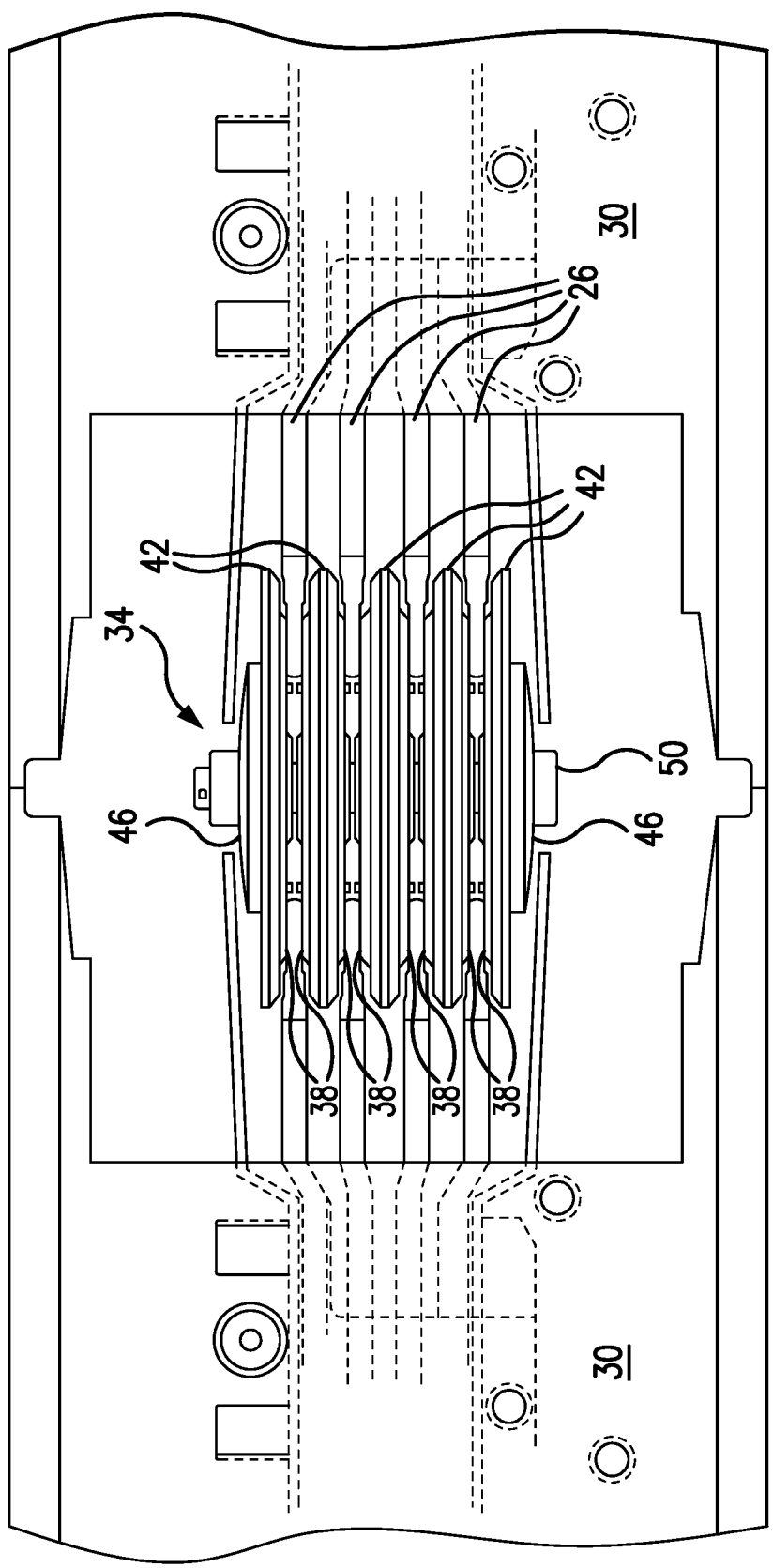
FIG. 2 illustrates a typical busway system joint pack, according to one embodiment described herein.

FIG. 1 illustrates components of a typical electrical distribution system 10 for workplaces requiring more electric power than homes and small business. Power from the utility provider enters the workplace through a service entrance panel 14 and is distributed throughout the workplace by a busway system 18. The busway system 18 consist of factory assembled busway sections 22 having standard lengths such as 10, 8, 6 and 4 feet and special lengths or fittings as required for the particular electrical distribution system 10 installation. Each busway section 22 includes electrical conductors (commonly known as busbars 26) enclosed in a busway housing 30. Each busway section 22 is electrically connected to an adjoining busway section 22 by a joint pack 34. The joint pack 34, as shown in FIG. 2, includes connector plates 38, which make the electrical connection between adjoining busway sections 22, insulators 42, which prevent electrical shorts between busbars 26 of different electrical phases and between the busbars 26 and the busway housing 30, spring washers 46 (Bellville washers), which compress against the outer insulators when a joint bolt 50 extending through the spring washers 46 is tightened. The joint bolt 50 provides the means for a tight electrical connection between the busbars 26 of the adjoining busway sections 22 when it is torqued to 70+/−10 ft/lbs.

Referring again to FIG. 1, busway sections 22 are generally manufactured in two types, feeder bus 54, which has no means for tapping off electrical power and plug-in bus 58, which has plug-in openings 62 (PIO) at intervals along its length for installing power tap-off devices 66. Feeder bus 54 is generally used for direct connections between the service entrance panel 14 and large sub panelboards 70, and horizontal runs where power tap-off devices 66 are not required. Plug-in bus 58 is used in areas where power is required for electrical equipment 74, such as small panelboards, lighting panels, motors control centers and any other electrical equipment 74 that may be required in the workplace. Busway systems 18 are generally installed near the ceiling in runs that are positioned above areas of the workplace floor 78 where electrical equipment 74 is located. The electrical equipment 74 is generally located on or near the workplace floor 78 and is generally connected to power tap-off devices 66 by conduit and cable 82.

Figure 3:
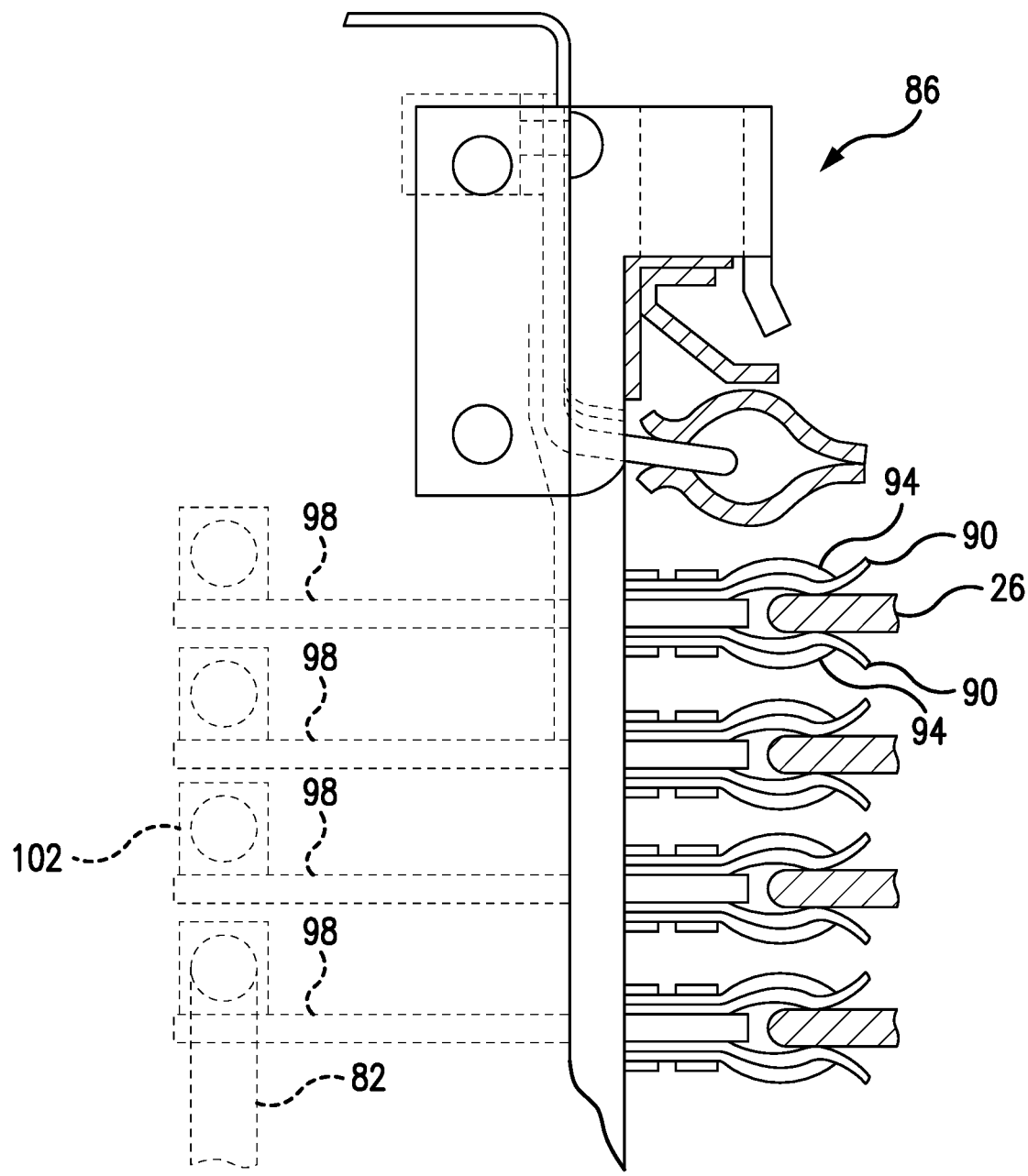
FIG. 3 illustrates a typical plug-in type tap-off device, according to one embodiment described herein.

The power tap-off devices 66 are generally of three types. A joint pack 34 as shown in FIG. 2, a plug-in unit (PIU) 86 as shown in FIG. 3 and a bolt-on tap-off unit 106, shown in FIG. 4. A plug-in unit (PIU) 86 as shown in FIG. 3 incorporates a pair of opposed jaws 90, which are pressed toward each other by springs 94 such that a tight electrical connection between the busbars 26 at a PIO 62 and the internal electrical conductors 98 of the plug-in unit 86 can be made. The internal electrical conductors 98 are generally connected to cable lugs 102, which connect to the electrical cables and conduit 82 providing power to electrical equipment 74 located on or near the workplace floor 78.

Figure 4:
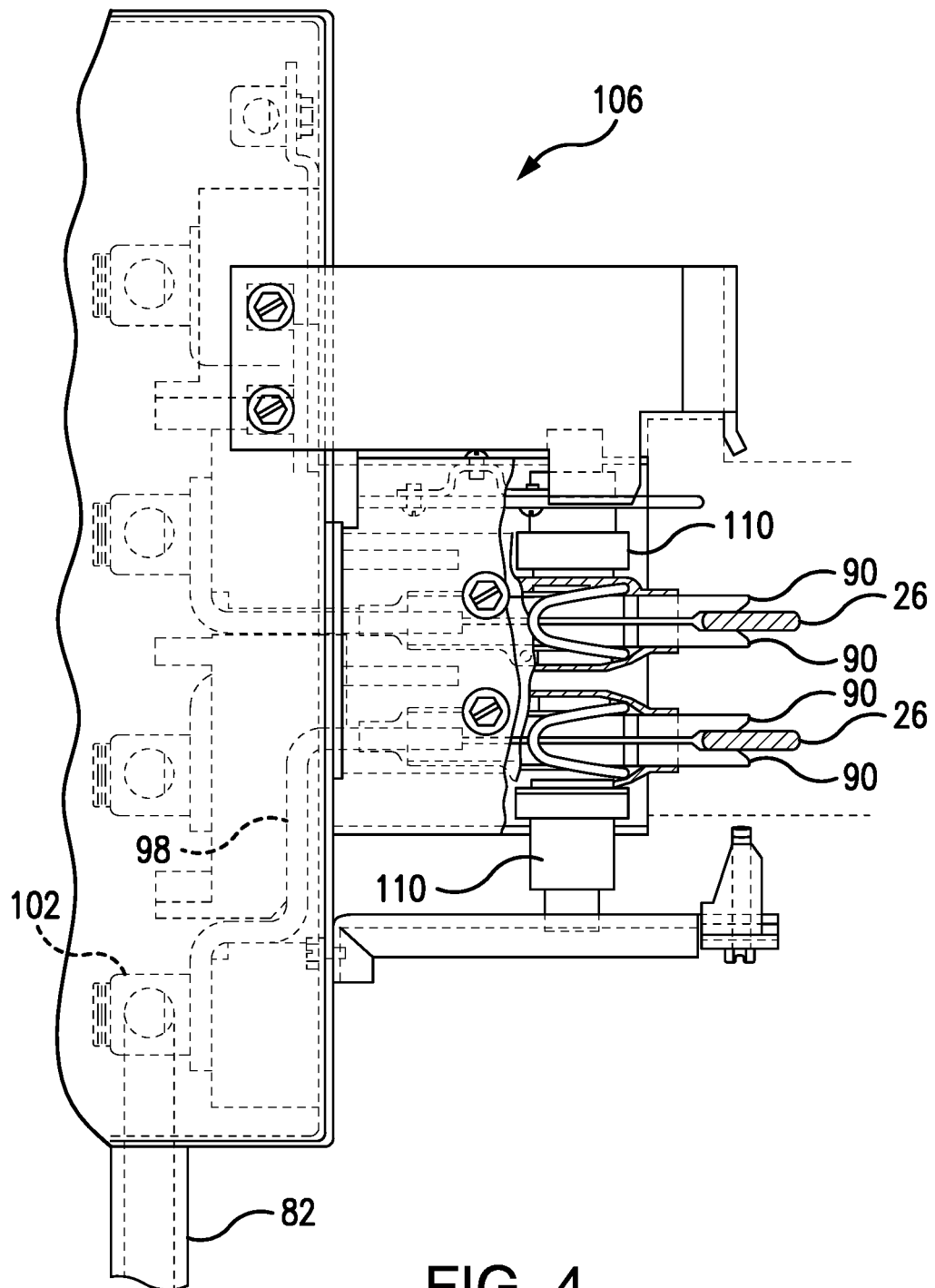
FIG. 4 illustrates a typical bolt-on type tap-off device, according to one embodiment described herein.

A bolt-on tap-off unit 106, shown in FIG. 4, also has opposed jaws 90, but they are clamped together by a bolt 110 to make a tight electrical connection between the busbars 26 at a PIO 62 and the internal electrical conductors 98 of the bolt-on tap-off unit 106. As in the plug-in unit 86, internal electrical conductors 98 are generally connected to cable lugs 102, which connect to the electrical cables and conduit 82 providing power to electrical equipment 74 located on or near the workplace floor 78.

Any of the electrical connections described above can degraded over time. This degradation is generally due to insufficient compression at the electrical connection, corrosion or contamination of contact surfaces, fretting or thermal expansion in over constrained systems. Any of these problems can increase resistance at the affected electrical connection, which is further exacerbated by normal cyclic heating and cooling caused by current drawn by the electrical equipment 74 connected to the electrical distribution system 10 and/or short circuit events or transient events in the electrical distribution system 10. As the electrical connection degrades, the temperature of the busbars 26 will increase. However, an elevated temperature of the busbars 26 can be caused by a higher than normal current draw and/or elevated ambient temperatures around the electrical connection. Therefore, it is recommended that these electrical connections should be monitored periodically to ensure that the electrical connections do not degrade. This has normally been accomplished by a person standing on the workplace floor 78 below the busway system 18 using an infrared thermometer or camera or a person on a motorized lift at the physical location of the electrical connection. In some instances, such as an obstructed joint pack 34 or potential hazards on the workplace floor 78 may require a second person on the workplace floor 78 or shutting down of the busway system 18. However, these methods are expensive and only provide a snapshot of the electrical connection's condition at the time it is being monitored.

Figure 5:
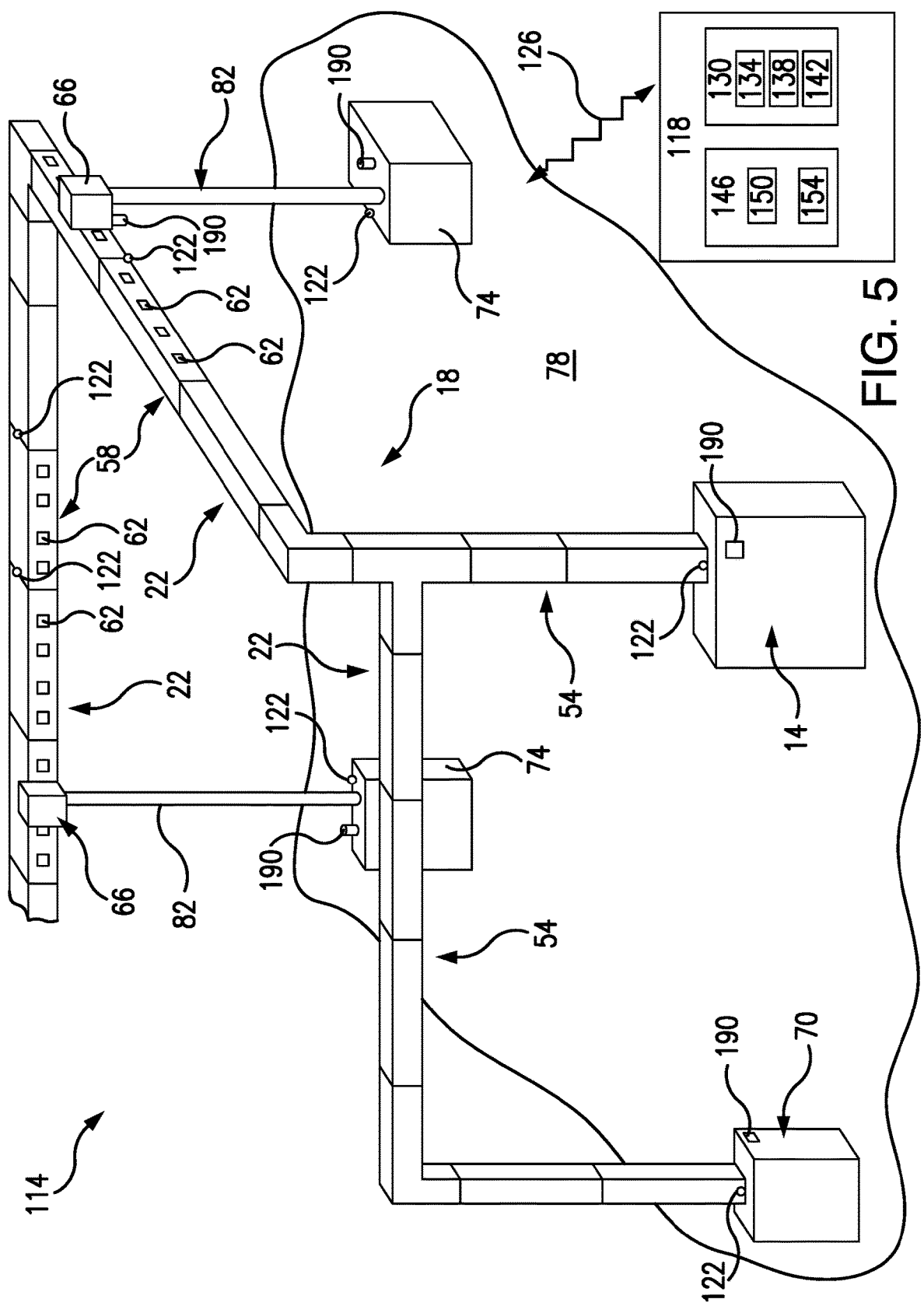
FIG. 5 illustrates a typical busway electrical distribution system on which a monitoring system of the present invention has been installed, according to one embodiment described herein.

FIG. 5 illustrates an electrical distribution system 10 on which a monitoring system 114 of the present invention has been installed. The monitoring system 114 provides continuous monitoring of some, or all, of the electrical connections in the electrical distribution system 10. The monitoring system 114 has a means for indicating the condition of each monitored electrical connection at the actual electrical connection location, at a remote monitoring station 118 in the workplace and to a responsible individual (electrical engineer or maintenance supervisor etc.) at any virtual location via network, internet or cell phone. The monitoring system 114 includes nodes 122, each node 122 being connected to a network 126, which could be a wireless network or a conventional hardwired network (not shown). The network 126 is connected to a remote monitoring device 130 at the remote monitoring station 118. The nodes 122 can be connected to the remote monitoring device 130 at the remote monitoring station 118 individually, in series, or a combination thereof. The remote monitoring device 130 includes a microprocessor 134 for interpreting the information received from the nodes 122. The interpreting is accomplished by the microprocessor 134 using an algorithm 138 stored in a memory 142 located in the remote monitoring device 130. The interpreted information is stored in the memory 142 and can be displayed on a Graphical User Interface (GUI) or monitor 146 at the remote monitoring station 118.

Figure 6:
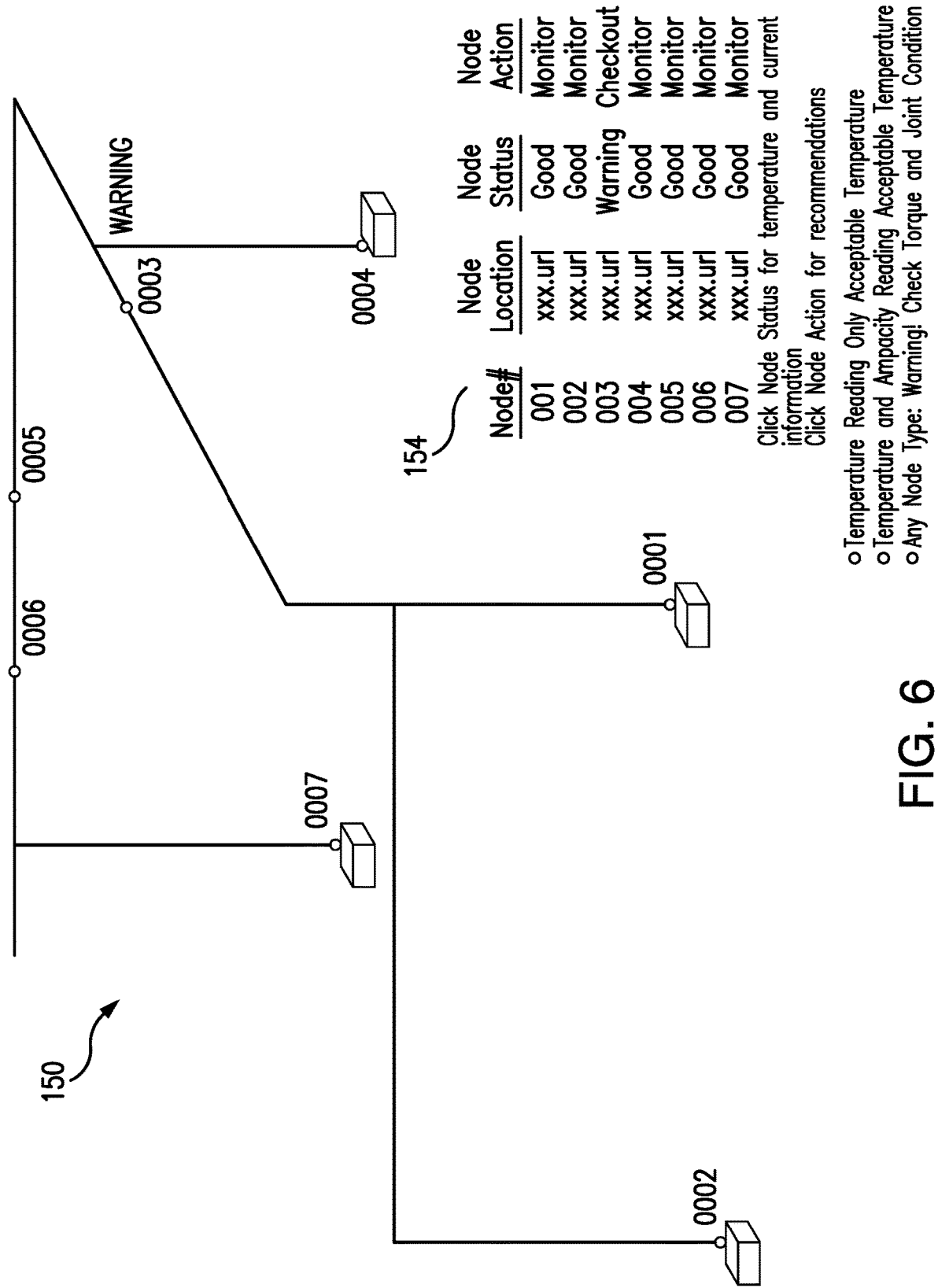
FIG. 6 illustrates an annotated 3D map of the electrical distribution system and nodes installed on the electrical distribution system and an associated node status chart, according to one embodiment described herein.
Figure 7:
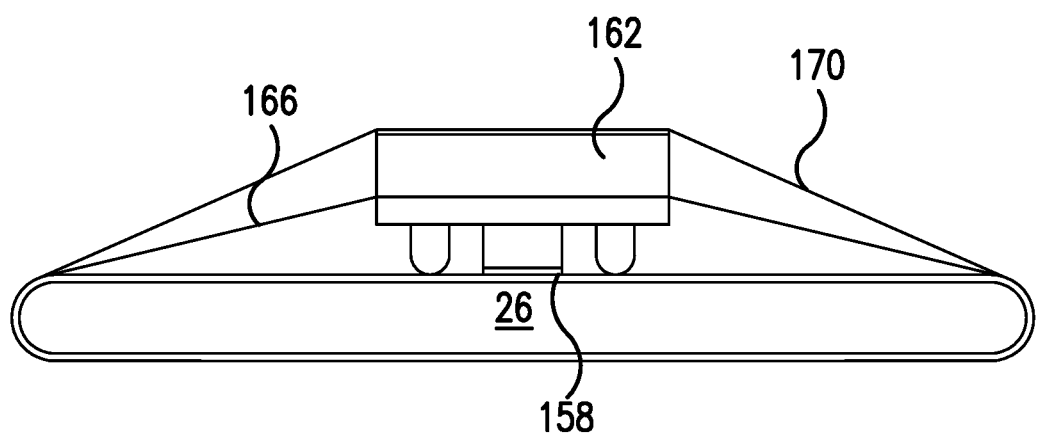
FIG. 7 illustrates the installation of sensing devices on a busbar, according to one embodiment described herein.

As illustrated in FIG. 6, the interpreted information is displayed on the monitor 146 as an annotated 3D map 150 of the electrical distribution system 10 including the placement of the installed nodes 122 and an associated node status chart 154. In the busway portion of the electrical distribution system 10 nodes 122 are located at the joint pack 34 between adjoining busway sections 22. Each node 122 has two parts, one inside the busway housing 30 at the joint pack 34 and one outside the busway housing 30 at the joint pack 34. The inside part includes sensing devices for monitoring elements such as temperature, current, voltage, power loss, humidity and the presence of water inside the busway housing 30. Referring to FIG. 7, the busbar temperature sensor 158 i.e. thermocouple, thermistor, resistance temperature detectors (RTD), silicon bandgap temperature sensor) and an energy harvesting ferromagnetic power supply 162 (HL110 or equivalent), are attached to the busbars 26 in an area (indicated in FIG. 8 by reference number 166) between the joint pack 34 and the busway housing 30 where the busbars 26 are spaced apart. The energy harvesting ferromagnetic power supply 162 includes a metal band 170 around the busbar 26 for enhancing the energy harvesting. The busbar temperature sensor 158 and energy harvesting ferromagnetic power supply 162 are attached to the busbar 26 by a self-gripping tape 174. A current sensor 178 (Rogowski coil or equivalent) and a water/humidity sensor 184 for monitoring the inside of the busway housing 30 are also located inside the busway housing 30. Any of the sensors described above can be used in any electrical equipment 74 that has at least one busbar 26 type electrical conductor connected to another electrical conductor. For instance, in power tap-off devices 66 the busbar temperature sensor 158, energy harvesting ferromagnetic power supply 162 and current sensor 178 (collectively indicated as reference number 200) can be attached to the internal electrical conductors 98. Electronics associated with the sensors listed above can be located outside the busway housing 30 to reduce exposure to heat generated by current flow in the busbars 26.

The monitoring system 114 may also be powered independent of the energy harvesting ferromagnetic power supply 162 or electrical power connected to the electrical distribution system 10. The independent power source could be one or more of a lithium battery, a capacitor, or the network 126. This may allow the installer and/or electrical maintenance teams to perform diagnostics on electrical joints that have a node 122—prior to energizing the electrical distribution system 10. This is a significant advantage, which allows the monitoring system 114 to detect installation errors and alert installers and/or electrical maintenance teams that corrective action should be performed before electrical power is supplied to the electrical distribution system 10. These installation errors could result in electrical insulation system damage, overheating and/or short circuits that could damage the electrical distribution system 10.

Figure 8:
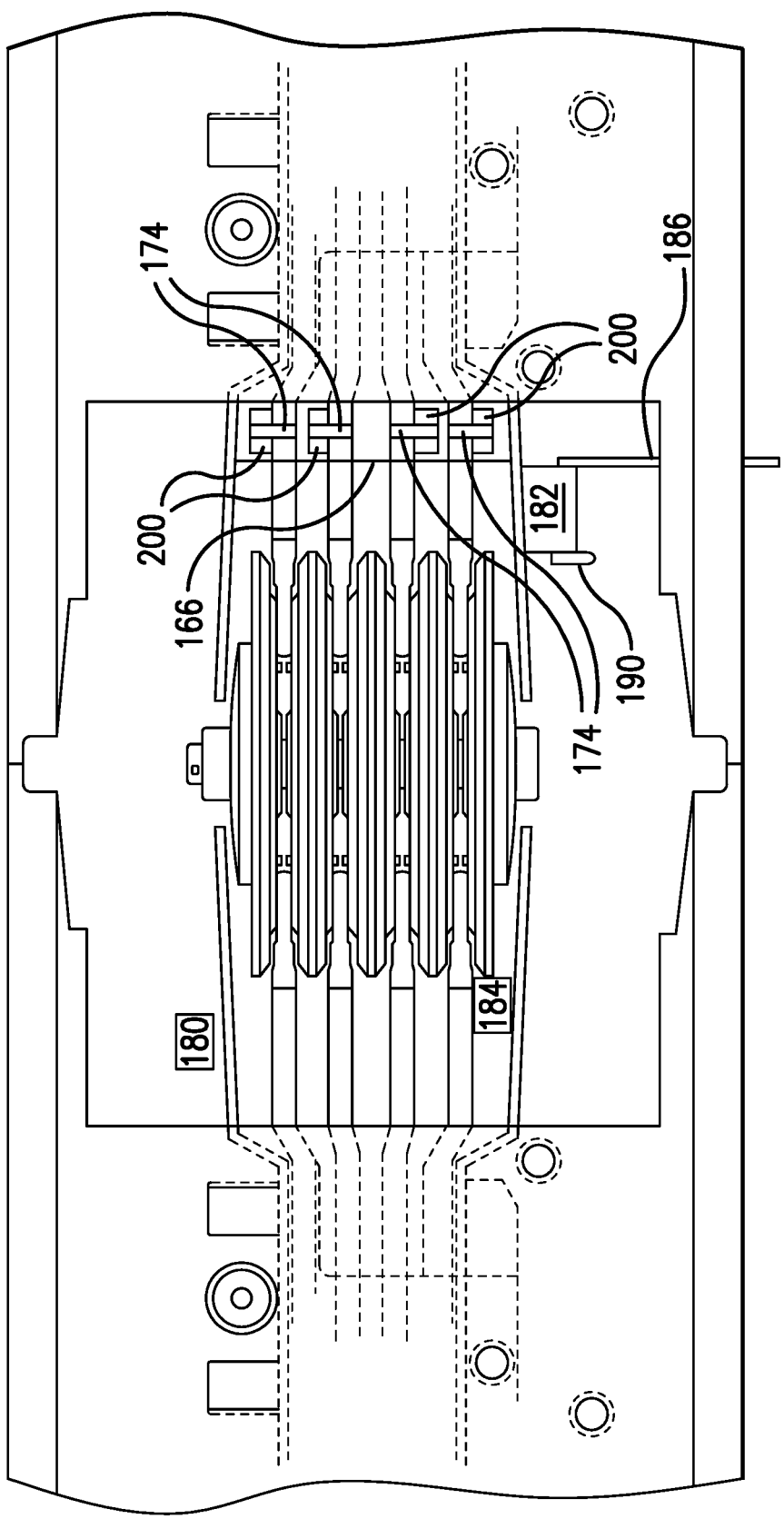
FIG. 8 illustrates a typical placement of sensing devices at a joint pack, according to one embodiment described herein.

Referring to FIG. 8, the outside part of each node 122 includes an ambient air temperature sensor 182 for monitoring the air temperature around the joint pack 34, a joint cover temperature sensor 180 for monitoring the temperature of the joint pack 34 and an antenna 186 for connecting to the network 126 the remote monitoring station 118, and a local node status indicator 190. The outside parts of the node 122 are attached to the bottom of the busway housing 30 at the joint pack 34 such that they are protected from water that might be dripping from a leaking roof or a fire protection sprinkler. The local node status indicator 190 is attached to the busway housing 30 such that it is clearly visible from the workplace floor 78. For other electrical equipment 74 in the electrical distribution system 10 (switchboards, switchgear, panelboards, motor control system, lighting panels, etc.) the local node status indicator 190 is located in an easily seen location on an exterior surface of the electrical equipment 74 enclosure. The local node status indicator 190 visually displays the current state of a state machine 230 that monitors electrical connections in-the electrical distribution system 10. The local node status indicator 190 visual display is provided by one or more LED lights that can display one or more colors. Each color is associated with the current status of monitored components of the electrical distribution system 10. For instance, Green=normal operation, Yellow=high temperature, Orange=low compressive force, Red=urgent action required, (Alternating Orange/Red=Low Compressive force/Urgent action required by the installers and/or electrical maintenance team). The light can also use a flash or strobe frequency to further indicate the status of monitored components of the particular node 122. The flash/strobe feature can also draw attention to a particular node 122 that has detected a potential power outage or damage to the electrical distribution system 10. Any means for attaching the outside part of the node 122 to the outside surface of the busway housing 30 or the exterior surface of the electrical equipment 74 enclosure can be used as long as it does not interfere with the operation of the electronic components or visibility of the local node status indicator 190.

Depending on the security or importance of the electrical distribution system 10 being monitored, nodes 122 can be placed at each joint pack 34 of the busway system 18 and each electrical connection of the attached electrical equipment 74, only on plug-in busway 58 joint packs 34, only on joint packs 34 after the first installed plug-in unit 86 or combinations of the above.

When the monitoring system 114 is powered by the energy harvesting ferromagnetic power supply 162 individual nodes 122 of the monitoring system 114 will go into a hibernation phase to save energy when their monitored current draw at the node 122 drops below approximately 50 amps and wake up when their monitored current draw exceeds approximately 50 amps. Nodes 122 having a monitored current draw greater than 50 amps will continue to send update information to the remote monitoring device 130. The update information includes at least the name or serial number of the node 122 its location in the electrical distribution system 10 and status of the monitored electrical connection. When the monitoring system 114 is powered by an independent power source the monitoring system 114 could monitor the nodes 122 continuously, at preset intervals, at preset times, or at the request of the remote monitoring device 130.

Figure 9:
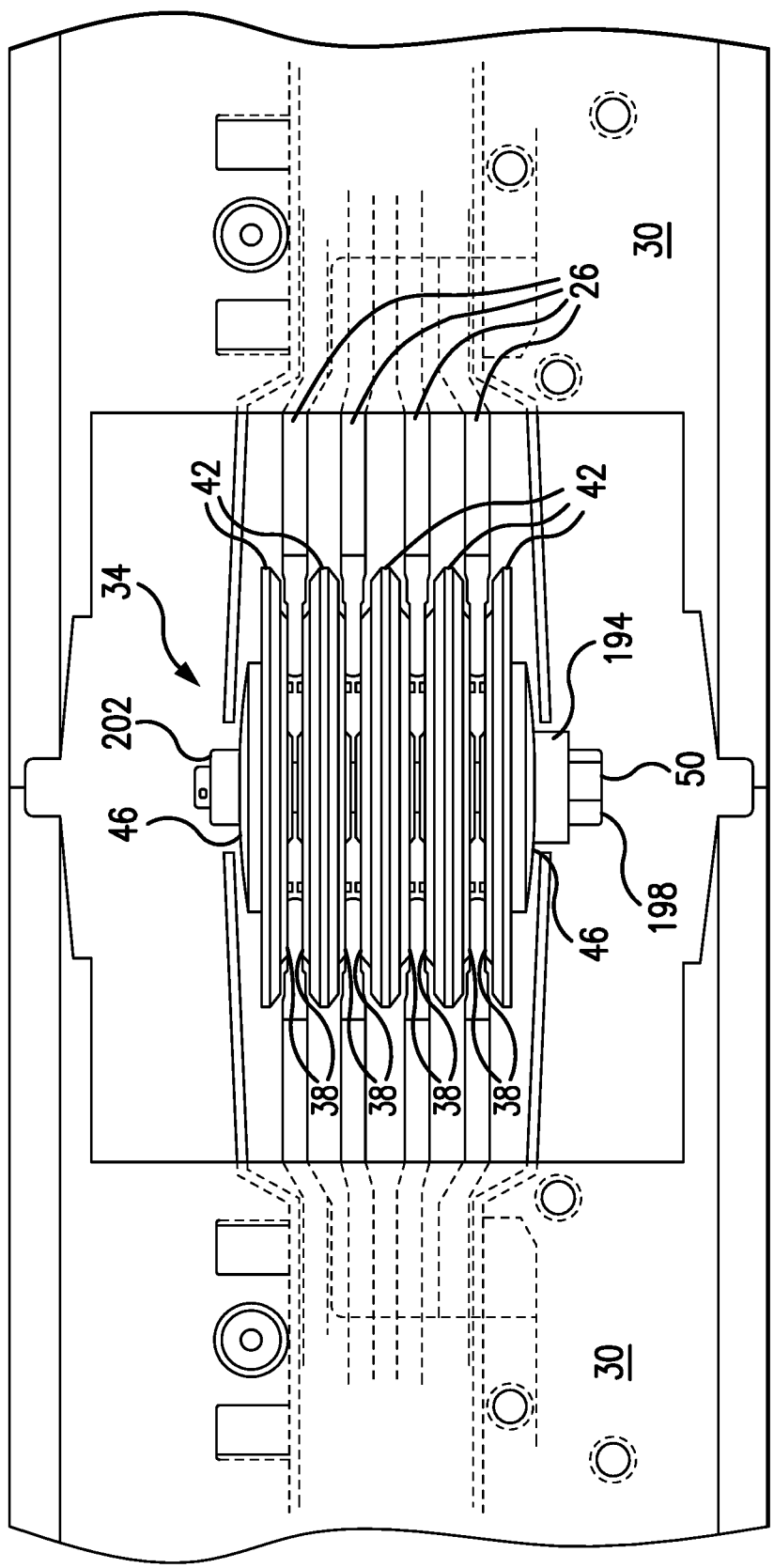
FIG. 9 illustrates an alternate method for determining a tight electrical connection between busbars of adjoining busway sections, according to one embodiment described herein.
Figure 10:
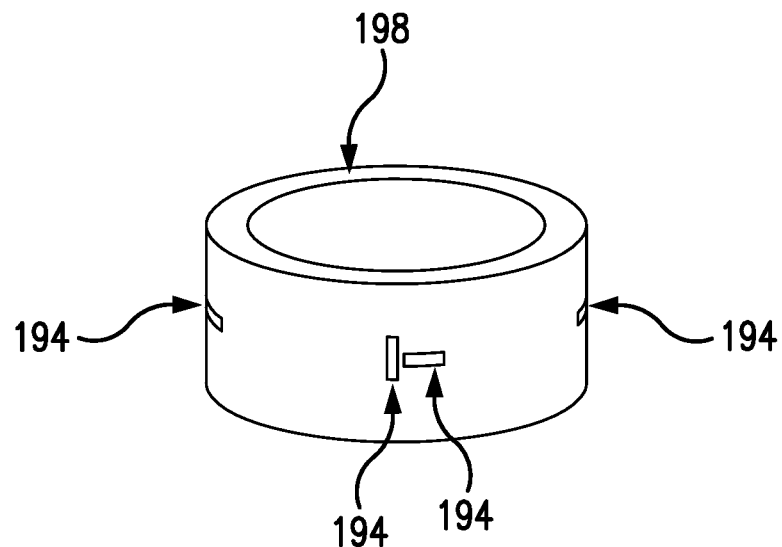
FIG. 10 illustrates an embodiment of the load sensor implementation of FIG. 9 according to aspects of the present disclosure.

The compressive forces or clamped joint forces can be measured by embedding a load sensor 194 in the electrical joint or in the direct compressive path. The load sensor 194 can be a load cell, a strain gauge, a thin film load sensor (e.g., a force sensing resistor) or similar means for measuring force. FIG. 9 illustrates an alternate construction of the joint pack 34 wherein a load sensor 194 can be installed between the spring washer 46 and the head 52 of joint bolt 50. FIG. 10 further illustrates the load sensor 194 of FIG. 9. In this embodiment one or more load sensors 194 are installed on a cylindrical base 198 that is slidably received on the joint bolt 50. The cylindrical base 198 could also be installed between the spring washer 46 and the nut 202 of joint bolt 50. The load sensor 194 determines the compressive force applied to the connector plates 38 and busbars 26 by the spring washer 46 of the joint pack 34.

Figure 12:
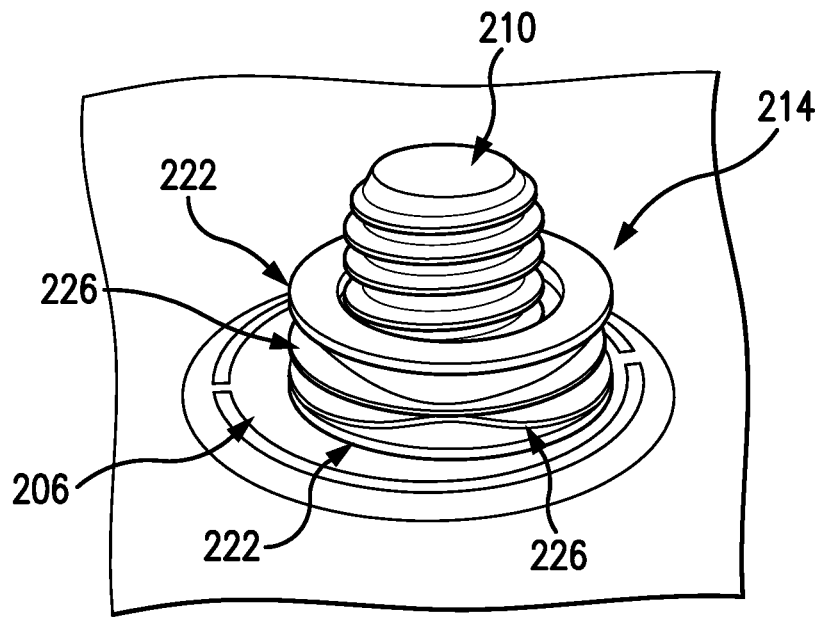
FIG. 12 illustrates a perspective view of an embodiment of a load sensor coupled to a hollow cylinder according to aspects of the present disclosure.

FIG. 12 shows an example wherein a thin film load sensor 206 is positioned on the threaded end 210 of a joint bolt 50 between a spring washer 46 and nut 202 (not shown).

Figure 11:
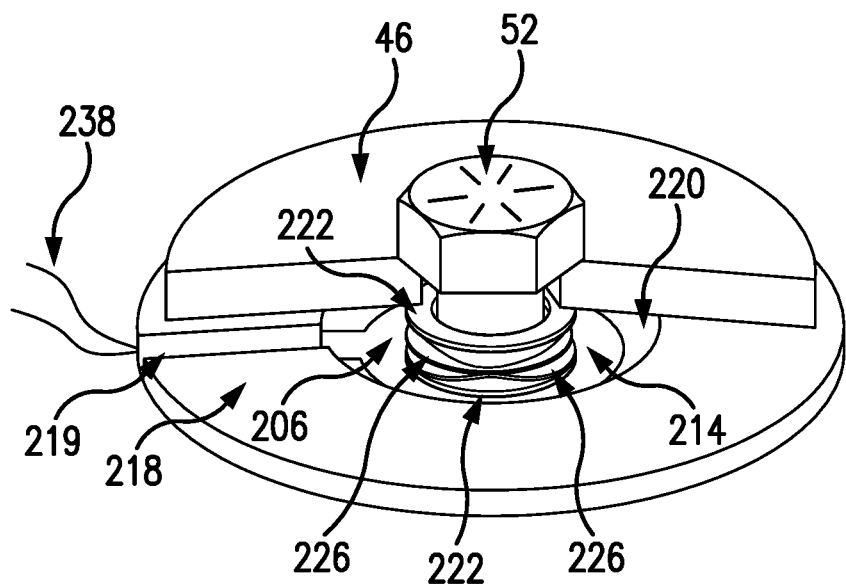
FIG. 11 illustrates a partial cutaway view of an embodiment of a load sensor implementation according to aspects of the present disclosure.

When a thin film load sensor 206 is employed, as in FIGS. 11 and 12, the force actually applied to the thin film load sensor 206 is reduced by a scaling device 214 to prevent damaging the thin film load sensor 206.

To accomplish this the compressive forces applied to the thin film load sensor 206 may be scaled down by the scaling device 214 to provide a reduced proportional force on the thin film load sensor 206. One method to provide this scaled proportional force is illustrated in FIGS. 11 and 12. In FIG. 11, a Belleville washer 46 is deflected by tightening the joint bolt 50 to provide a large compressive force on the electrical joint through a spacer 218. The spacer 218 defines a pocket 220 between the Bellville washer 46 and the top of the joint pack 34 for the scaling device 214 to operate in while allowing the full force of the deflected Bellville washer 46 to be exerted on the electrical joint through the spacer 218. The spacer 218 having means, such as a narrow slot 219, for connecting the pocket 220 to the area 166 between the joint pack 34 and the busway housing 30, such that a connection to the antenna 186 or the conventional hardwired network via the load sensor conductors 238 (not shown) can be accomplished. The scaling device 214 comprising a series of flat washers 222, wavy washers 226 and the thin film load sensor 206, may be placed under the Belleville washer 46. The Belleville washer 46 deflection, resulting from tightening the joint bolt 50, will compress the wavy washer(s) 226 in the scaling device 214. The wavy washers 226 have a lower spring constant and produce a lower force on the thin film load sensor 206. The thin film load sensor 206 is capable of being monitored by the remote monitoring device 130 at the remote monitoring station 118. The remote monitoring device 130 may include one or more of a microprocessor 134 having an associated memory 142, a state machine 230 stored in the memory 142, the state machine indicating the current state of the monitored electrical connections in the electrical distribution system 10 and, an algorithm 138 stored in the memory 142, the microprocessor 134 using the algorithm 138 and information from the monitoring system 114 to determine the current state of the state machine 230. The node 122 utilizes sensing devices to sense the compression force in the electrical joint, temperature of the joint and the moisture at the electrical joint.

Figure 14:
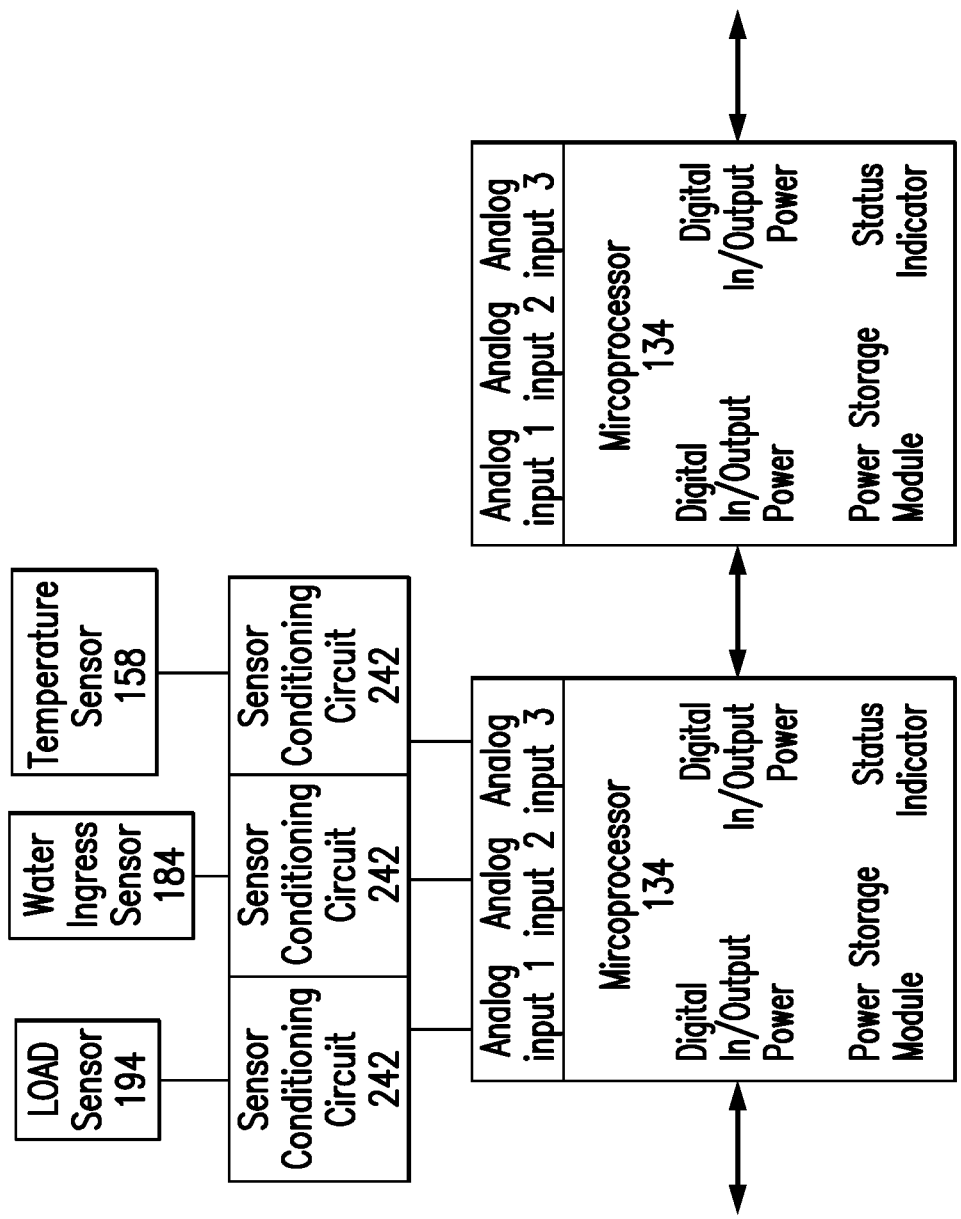
FIG. 14 illustrates a partial block diagram of an embodiments of a monitoring system according to aspects of the present disclosure.

As indicated in FIG. 14, information from the various sensing devices will require conditioning (amplification and filtering the sensor signals to the optimal range for the analog to digital converter of the microprocessor 134) by an associated conditioning circuit 242 before being accepted by or used by the microprocessor 134. The microprocessor 134, using the conditioned information from the conditioning circuit 242, an algorithm 138 and correction factors for calibration, drift factors, temperature, and time since the load sensor 194 has been monitored are stored in the memory 142, to determine the performance level of the electrical joint and the current state of the state machine 230. The compensated compressive force, temperature and moisture level are communicated back to the remote monitoring device 130, a light source, operating in response to the current state of the state machine 230, displays a visible coded signal indicating a current state of the electrical joint monitoring system 114.

Figure 13:
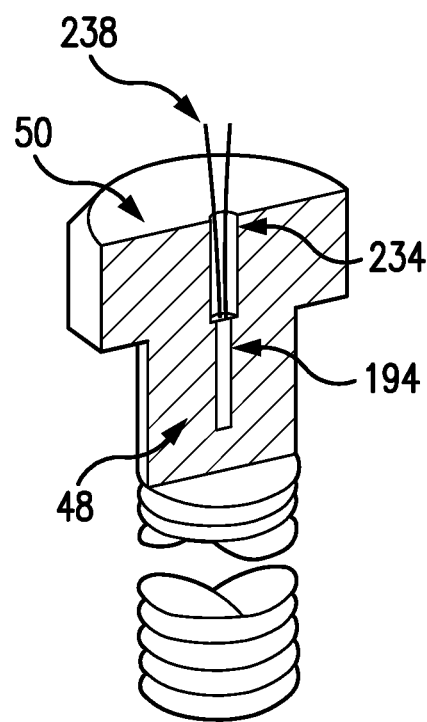
FIG. 13 illustrates a partial cutaway view of an embodiment of a load sensor embedded in a bolt shank according to aspects of the present disclosure.

FIG. 13 shows another embodiment wherein the load sensor 194 is embedded into a cavity 234 defined in the shank 48 of the joint bolt 50. The cavity 234 is bored along the longitudinal centerline of the joint bolt 50. Load sensor conductors 238 from the load sensor 194 exit the cavity 234 and connect to the node 122 which is connected to the remote monitoring station 118 by the network 126.

An alternate construction of the load sensor 194 can be washer shaped similar to the spacer 218 but, as in the spacer 218, must be at least as large in diameter as the spring washer 46 in order to exert the full compressive force applied to the spring washer 46 to the join pack 34 by the tightened joint bolt 50. In this construction the load sensor conductors 238 exits the washer like load sensor 194 along its perimeter, which should be at least equal to the diameter of the spring washer 46 to prevent possible damage to the load sensor conductors 238.

In another alternate construction of the monitoring system 114 each node 122 may include one or more of a microprocessors 134 having an associated memory 142, a state machine 230 stored in the memory 142, an algorithm 138 stored in the memory 142, the microprocessor 134 using the algorithm 138 and information from the sensing devices and conditioned by a conditioning circuit 242 to determine the current state of the state machine 230 which it displays on the local node status indicator 190. The node 122 sends the determined current state of the state machine 230 to the remote monitoring device 130, which stores the determined current state in its memory 142.

The monitoring system 114 of the present invention has been designed such that it can be retrofit on existing installed busway systems 18.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

The invention claimed is:

1. A monitoring system for critical electrical distribution systems, the systems comprising:
    an electrical distribution system constructed from preassembled sections, each section including one or more insulated electrical conductors enclosed within a housing, the electrical conductors of adjoining sections being electrically connected together by a joint pack which includes connector plates that engage end portions of the electrical conductors of adjoining sections, the connector plates and electrical conductors being compressed together by spring washers as a joint bolt passing through the spring washers is tightened thereby completing the electrical connection of the adjoining electrical conductors; some preassembled sections include plug-in openings which permit power tap-off devices to the electrical conductors inside the housing such that electrical power from the electrical distribution system can be provided to electrical equipment; and
    a monitoring system having at least one node attached to the electrical distribution system adjacent to the electrical connection of two sections of the electrical distribution system, the node having sensing devices for monitoring the electrical connection of the adjoining electrical conductors and the intermediate joint pack, the node being in communication with a remote monitoring device at a remote monitoring station, the remote monitoring device evaluates information received from the sensing devices to determine a current state of the electrical connection of the adjoined electrical conductors and their intermediate joint pack, the determined current state of the electrical connection being displayed at one or both of the remote monitoring station and a local node status indicator located adjacent to the node.

2. The monitoring system for critical electrical distribution systems of claim 1, wherein the electrical equipment includes at least one of switchboards, switchgear, panelboards, motor control system, or lighting panels, which can have nodes attached such that their electrical connection to the electrical distribution system can be monitored by the monitoring system.

3. The monitoring system for critical electrical distribution systems of claim 1, the node includes an inside part that includes sensing devices for monitoring elements such as electrical conductor temperature, current, voltage, power loss, compressive force, humidity and the presence of water/moisture inside the housing and an outside part that includes an ambient air temperature sensor for monitoring the air temperature around the joint pack, a temperature sensor on the joint pack cover for monitoring the joint pack temperature the local node status indicator and means for communicating with the remote monitoring device via a wired or wireless network.

4. The monitoring system for critical electrical distribution systems of claim 1, wherein the local node status indicator employs colored lights and/or strobe frequencies to indicate the current state of the electrical connection at its associated node.

5. The monitoring system for critical electrical distribution systems of claim 1, wherein a load sensor is used to determine the compressive force applied to the adjoined electrical conductors and their intermediate joint pack by the spring washer and tightened joint bolt, the load sensor can be a load cell, a strain gauge or a thin film load sensor.

6. The monitoring system for critical electrical distribution systems of claim 5, wherein the force actually applied to the thin film load sensor is reduced by a scaling device residing in a pocket defined by the spring washer and a spacer, the spacer exerts the full force of the spring washer and tightened joint bolt on joint pack.

7. The monitoring system for critical electrical distribution systems of claim 6, wherein the scaling device includes a sandwich of flat washers and wavy washers slidably received on the joint bolt and compressed by the spring washer as the joint bolt is tightened.

8. The monitoring system for critical electrical distribution systems of claim 1, wherein the remote monitoring device includes a microprocessor, a conditioning circuit, a memory, and an algorithm stored in the memory, information received at the remote monitoring device from the sensing devices of a particular node is passed through the conditioning circuit before being accepted by or used by the microprocessor, the microprocessor uses the conditioned information and the algorithm to determine the current state of the electrical connection at particular node.

9. The monitoring system for critical electrical distribution systems of claim 8, wherein the remote monitoring device communicates the current state of the electrical connection at the particular node to the particular node, which displays its current state on the local node status indicator.

10. The monitoring system for critical electrical distribution systems of claim 1, wherein the sensing devices include a temperature sensor located on the joint pack cover for monitoring the joint pack temperature.

11. A monitoring system for a critical electrical distribution system, the monitoring system comprising:
    at least one node having at least one sensing device for sensing a characteristic of the critical electrical distribution system that could require unscheduled down time for maintenance or repair;
    the at least one sensing device being a temperature sensor, a current sensor, a voltage sensor, a power loss sensor, a water/humidity sensor, or a load sensor;

the at least one node having one or more of a microprocessor having an associated memory, a state machine stored in the memory, a conditioning circuit for conditioning the sensed information and, an algorithm stored in the memory, the microprocessor using the algorithm the conditioned sensor information and information from the monitoring systems to determine the current state of the critical electrical distribution system;

the microprocessor displaying the current state of the critical electrical distribution system on at least one of a local node status indicator or the remote monitoring device;

the microprocessor storing the current state of the critical electrical distribution system in its associated memory, and the remote monitoring device storing the current state of the critical electrical distribution system in its memory.

12. The monitoring system of claim 11, wherein the electrical equipment includes switchboards, switchgear, panelboards, motor control system, lighting panels, all of which can have nodes attached such that their electrical connection to the critical electrical distribution system can be monitored by the monitoring system.

13. The monitoring system of claim 11, wherein the local node status indicator employs colored lights and/or strobe frequencies to indicate the current state of the critical electrical distribution system at its associated node.

14. The monitoring system of claim 11, wherein each node of the monitoring system is powered by its own energy harvesting ferromagnetic power supply which harvests power from the current flowing in the critical electrical distribution system;

individual nodes of the monitoring system will enter a hibernation phase to save energy when their monitored current draw at the node drops below approximately 50 amps and wake up when their monitored current draw at the node exceeds approximately 50 amps;

nodes having a monitored current draw greater than 50 amps will continue to monitor the critical electrical distribution system and send update information to the remote monitoring device;

update information includes at least the name or serial number of the node the node's location in the critical electrical distribution system and status of the electrical connection monitored by the node.

15. The monitoring system of claim 11, wherein the monitoring system is powered by an independent power source other than an energy harvesting ferromagnetic power supply or power from the critical electrical distribution system.

16. The monitoring system of claim 15, the monitoring system could monitor the nodes continuously, at preset intervals, at preset times, monitor at dynamic intervals dependent on the rate of change of the sensors and/or the proximity to thresholds or at the request of the node.

17. The monitoring system of claim 11, wherein each node is individually connected to the remote monitoring device.

18. The monitoring system of claim 11, wherein the nodes are serially connected to the remote monitoring device.

* * * * *